United States Patent [19]

Kawahara et al.

[11] Patent Number: 5,274,601
[45] Date of Patent: Dec. 28, 1993

[54] SEMICONDUCTOR INTEGRATED CIRCUIT HAVING A STAND-BY CURRENT REDUCING CIRCUIT

[75] Inventors: Takayuki Kawahara, Hachioji; Yoshiki Kawajiri, Akishima; Takesada Akiba, Tachikawa; Masashi Horiguchi, Kawasaki; Takao Watanabe, Ingai; Goro Kitsukawa, Tokyo; Yasushi Kawase; Toshikazu Tachibana, both of Tachikawa; Masakazu Aoki, Tokorozawa, all of Japan

[73] Assignees: Hitachi, Ltd., Tokyo; Hitachi Device Engineering Co., Ltd., Mobara, Japan

[21] Appl. No.: 972,545

[22] Filed: Nov. 6, 1992

[30] Foreign Application Priority Data

Nov. 8, 1991 [JP] Japan .................................. 3-292688

[51] Int. Cl.⁵ ............................................ G11C 8/00
[52] U.S. Cl. .............................. 365/230.06; 307/571
[58] Field of Search .................. 365/230.06, 226, 229; 307/571, 576, 304

[56] References Cited

U.S. PATENT DOCUMENTS 4,953,133  8/1990  Kashimura ............... 365/230.06
5,200,921  4/1993  Okijima .................... 365/226

Primary Examiner—Eugene R. LaRoche
Assistant Examiner—A. Zarabian
Attorney, Agent, or Firm—Antonelli, Terry, Stout & Kraus

[57] ABSTRACT

A device parameter of a switching transistor is set in such a way that a leakage current of the switching transistor making up a power source switch which is turned off in a stand-by state is smaller than the sum total of subthreshold currents of P-channel or N-channel MOS transistors in an off state of a plurality of CMOS circuits. Therefore, the currents which flow through the plurality of CMOS circuits in the stand-by state are not determined by the subthreshold current but are determined by a small leakage current of the switching transistor. As a result, even when the CMOS circuit is shrunken and the subthreshold current increases, it is possible to reduce the current consumption in the stand-by state.

28 Claims, 8 Drawing Sheets

SEMICONDUCTOR INTEGRATED CIRCUIT HAVING A STAND-BY CURRENT REDUCING CIRCUIT

BACKGROUND OF THE INVENTION

The present invention relates to a semiconductor integrated circuit which has high integration density and is capable of reducing current consumption in a stand-by state.

As for a semiconductor integrated circuit in which current consumption in a stand-by state is very small, there is well known a CMOS circuit. When an input is at a high level, a P-channel MOS transistor is on, and an N-channel MOS transistor is on. When the discharge of a capacitive load of an output has been completed, an N-channel MOS transistor is turned off, and in this state, the power consumption can be disregarded. When the input is set at a low level, the P-channel MOS transistor is on, and the N-channel MOS transistor is off. When the charge of the capacitive load of the output has been completed, the P-channel MOS transistor is turned off, and even in this case, similarly the power consumption can be disregarded.

On the other hand, a semiconductor integrated circuit of high integration density which is designed in such a way that shrunken MOS transistors are used in an internal circuit within a chip, and an internal source voltage, which is lower than an external source voltage, is generated by a voltage dropping circuit (on-chip voltage limiter) provided in the chip in order to cope with the decrease of a breakdown voltage of the MOS transistor accompanying with the shrink, thereby to supply the internal source voltage to the internal circuit is heretofore described in U.S. Pat. No. 4,482,985 (issued to Itoh et al on Nov. 13, 1984 and assigned to the assignee of the present invention).

On the other hand, in U.S. Pat. No. 4,873,673 (issued to Hori et al on Oct. 10, 1989 and assigned to the assignee of the present invention) is disclosed a system which is designed in such a way that a rising speed of a transient current of an internal circuit just after applying a power is increased, while in order to control a peak value of the transient current, a current mirror circuit is connected between an external power source and an internal circuit to limit a current to be supplied to the internal circuit, and also the increase of the voltage, which is applied to the internal circuit, is clamped at a predetermined value by the negative feedback.

Recently, the fine pattern technology used for the semiconductor integrated circuit has been remarkably developed, and the processing dimension is approaching 0.1 $\mu$m. As compared with the MOS transistor having a channel length of 1 $\mu$m, even when a threshold voltage of the MOS transistor having a channel length of about 0.1 $\mu$m is decreased, and also the voltage across a gate and a source of that MOS transistor is less than or equal to the threshold voltage, a drain current does not become zero. A leakage current in a subthreshold region in which that voltage across the gate and the source is less than or equal to the threshold voltage is called a subthreshold current.

SUMMARY OF THE INVENTION

As described above, for the purpose of improving the integration density of the semiconductor integrated circuit, the shrunken MOS transistor needs to be used in the internal circuit. However, there arises a problem in that the increase of the subthreshold current, which occurs along with the shrink, is against the request of the low power consumption. Especially, the power consumption in a non-operating state of the semiconductor integrated circuit in which the shrunken MOS transistors are used is determined by that subthreshold current, and thus it is necessary for the attainment of the low power consumption to control the subthreshold current.

On the other hand, even in the CMOS circuit, when the MOS transistor is shrunken, the subthreshold current becomes a problem. Even in the stand-by state in which the input is fixed and the charge or the discharge of the capacitive load of the output is completed the current of one of the normally-off P-channel and N-channel MOS transistors does not become zero. Thus the power consumption in the stand-by state becomes a problem.

Now, a word driver for driving a word line of a semiconductor memory is composed of a CMOS circuit, whereby the low power consumption of the semiconductor memory is attained. However, if each MOS transistor of the CMOS circuit of the word driver is shrunken, there arises a problem as will hereinbelow be described. That is, since a parasitic capacity of the word line is large, the MOS transistor having a large gate width needs to be used for a driving transistor for the word driver. However, since the subthreshold current increases in proportion to the gate width, if the MOS transistor having a large gate width is used for the driving transistor for the word driver, there arises a problem in that the power consumption of the CMOS circuit of the word driver in the stand-by state increases.

That is, since the semiconductor memory employs generally a large number of word drivers, it is required to control the subthreshold current of the driving MOS transistor of the word driver composed of the CMOS circuit. For example, taking a 4 Mb-DRAM as an example, a period of about 15.9 msec out of a refresh period of 16 msec (indeed, a period of 99% or more of the refresh period) is the period when all of the word lines are in a non-selection state, and in the non-selection state, the subthreshold current of the driving MOS transistor of the word driver is caused to flow. Therefore, there arises a problem in that the power consumption in the non-selection state is determined by the subthreshold current of the driving MOS transistor shrunken of the word driver. Such a problem becomes worse especially in case of the semiconductor integrated circuit which is operated by a battery.

On the other hand, assuming that the technology of the voltage dropping circuit disclosed in U.S. Pat. No. 4,482,985 is applied to the above-mentioned semiconductor memory such as DRAM, the internal source voltage of the internal circuit which includes the MOS transistor having a large subthreshold current is supplied from the output of the on-chip voltage limiter. In this case, since the on-chip voltage limiter does not have a capability of limitting a current with respect to the output current thereof, it is impossible to reduce the subthreshold current which becomes a problem in the above cases.

On the other hand, assuming that the technology of the current mirror circuit disclosed in U.S. Pat. No. 4,487,673 is applied to the above semiconductor memory such as DRAM, both the internal source voltage and the internal source current of the internal circuit, which includes the MOS transistor having a large subthreshold current, are supplied from the output transistor of the current mirror circuit. In this case, however, though the current mirror circuit has a current limitting capability of limitting a peak value of the transient current of the internal circuit to a value less than or equal to a predetermined value, this predetermined value is much larger than the above-mentioned subthreshold current. Thus, likewise, it is impossible to reduce the subthreshold current which becomes a problem in the above cases.

It is therefore an object of the present invention to provide a semiconductor integrated circuit in which even if a shrunken CMOS circuit is used, the power consumption in a stand-by state is not determined by a large subthreshold current accompanying with the shrink.

There is provided a semiconductor integrated circuit according to a typical aspect of the present invention, which is capable of attaining the above object, comprising, as shown in FIG. 5:

a switching P-channel MOS transistor S1 having a source, a drain and a gate; and a plurality of CMOS circuits C1 to Cn having a first power supply node N1 and a second power supply node N2, wherein the source of the switching P-channel MOS transistor S1 is coupled with a first operating potential VC, the gate of the switching P-channel MOS transistor S1 is controlled by a control signal T1, the drain of the switching P-channel MOS transistor S1 is coupled with the first power supply node N1 of the plurality of CMOS circuits C1 to Cn, and the second power supply node N2 of the plurality of CMOS circuits C1 to Cn is coupled with a second operating potential VS, wherein a first subthreshold current flows through the source-drain path of the switching P-channel MOS transistor S1 in case that the control signal T1 value of which is smaller than the threshold voltage of the switching P-channel MOS transistor S1 is supplied between the source and the gate of the switching P-channel MOS transistor S1, and in case that the first power supply node N1 and the second power supply node N2 of the plurality of CMOS circuits C1 to Cn are short-circuited, wherein second subthreshold currents flow through source-drain paths of P-channel MOS transistors of the plurality of CMOS circuits C1 to Cn in case that signals values of which are smaller than threshold voltages of the P-channel MOS transistors are respectively supplied between the sources and the gates of the P-channel MOS transistors, and in case that the source and the drain of the switching P-channel MOS transistor S1 is short-circuited, and wherein a device parameter of the switching P-channel MOS transistor S1 is set to a predetermined value such that the first subthreshold current is set to a value smaller than the second subthreshold currents.

According to the semiconductor integrated circuit of the above typical aspect, in the stand-by state, the subthreshold current is caused to flow through the switching P-channel MOS transistor by the control signal, and each of currents flowing through the plurality of CMOS circuits is limited to the subthreshold current. Therefore, the primary object is attained.

The plurality of P-channel MOS transistors of the plurality of CMOS circuits of the semiconductor integrated circuit may form, for example, together with a plurality of N-channel MOS transistors, a plurality of CMOS inverter circuits.

Moreover, the above-mentioned plurality of CMOS circuits are used for word driver circuits of a semiconductor memory which includes a plurality of word lines, a plurality of data lines arranged so as to cross the plurality of word lines, and memory cells arranged at intersections between the plurality of word lines and the plurality of data lines.

Moreover, a semiconductor integrated circuit according to a more preferable aspect of the present invention may provide, as shown in FIG. 7, including a voltage clamping circuit L for maintaining a potential at the first power supply node N1 at a predetermined potential between the first operating potential VC and the second operating potential VS.

For example, the voltage clamping circuit L is composed of an N-channel MOS transistor which has a drain coupled with the first operating potential VC, a gate coupled with a predetermined potential, and a source connected to the first power supply node N1. Incidentally, even if the gate and the drain of the N-channel MOS transistor are short-circuited, likewise, the above voltage clamping circuit is realized.

Moreover, though the switch S1 shown in FIG. 5 includes the P-channel MOS transistor, the P-channel MOS transistor may be replaced with a PNP transistor. In this case, the gate, the source and the drain of the P-channel MOS transistor correspond to a base, an emitter and a collector of the PNP transistor, respectively.

Moreover, in the connection shown in FIG. 3, a switch S2 may include an N-channel MOS transistor or an NPN transistor. In this case as well, a gate, a source and a drain of the N-channel MOS transistor correspond to a base, an emitter and a collector of the NPN transistor, respectively.

DESCRIPTION OF THE PREFERRED EMBODIMENTS

The preferred embodiments of the present invention will hereinafter be described with reference to the accompanying drawings. Incidentally, unless otherwise stated, the reference symbols for designating terminal names also designate wiring names and signal names, and in case of a power supply, such a reference symbol designates a voltage value as well as the power supply.

FIRST EMBODIMENT

Figure 1:
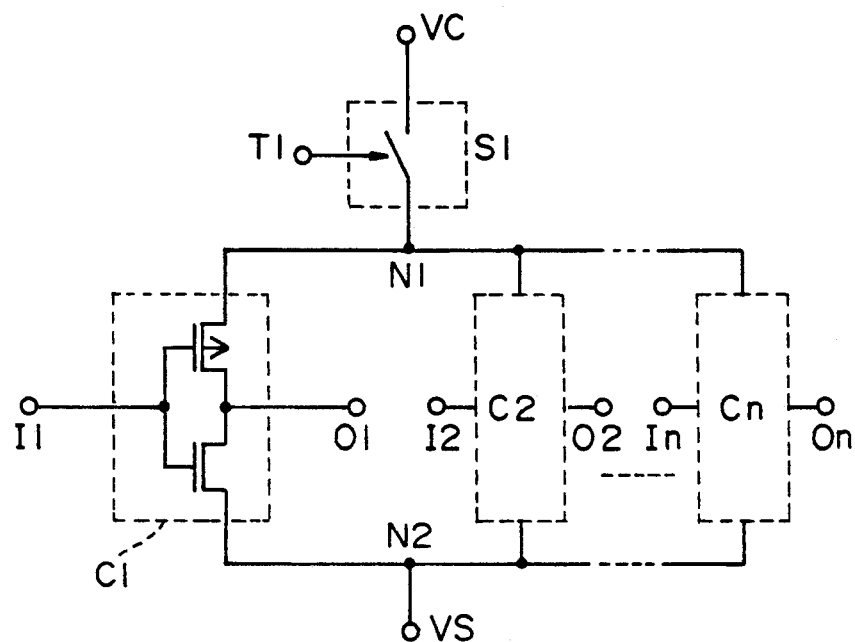
FIG. 1 is a circuit diagram showing a first embodiment of the present invention.

FIG. 1 is a circuit diagram showing a first embodiment of the present invention. The reference symbol $C_i$ (i=1 to n) designates a logical circuit or a driver composed of a CMOS transistor. In this case, however, by paying attention to the drive of an output terminal $O_i$, a simple CMOS inverter is taken as an example. The reference symbol $I_i$ designates an input terminal of the CMOS inverter $C_i$. The reference symbols VS and VC designate respectively power source lines from an external power source and an internal power source generated by an internal conversion circuit such as an internal voltage dropping circuit or an internal booster circuit. The external source voltage is in the range of about 1.5 to about 3.6 V for example. VC is set to the range of 1.5 to 2.5 V for example. Vs is normally 0 V. A switching circuit S1 is connected between $C_i$ and VC. The reference symbol T1 designates a control terminal of the switching circuit S1. The switching circuit S1 is composed of a MOS transistor or a bipolar transistor for example. The reference symbol N1 designates a first power supply node of the group of CMOS inverters. The reference symbol N2 designates a second power supply node of the group of CMOS inverters.

Figure 2:
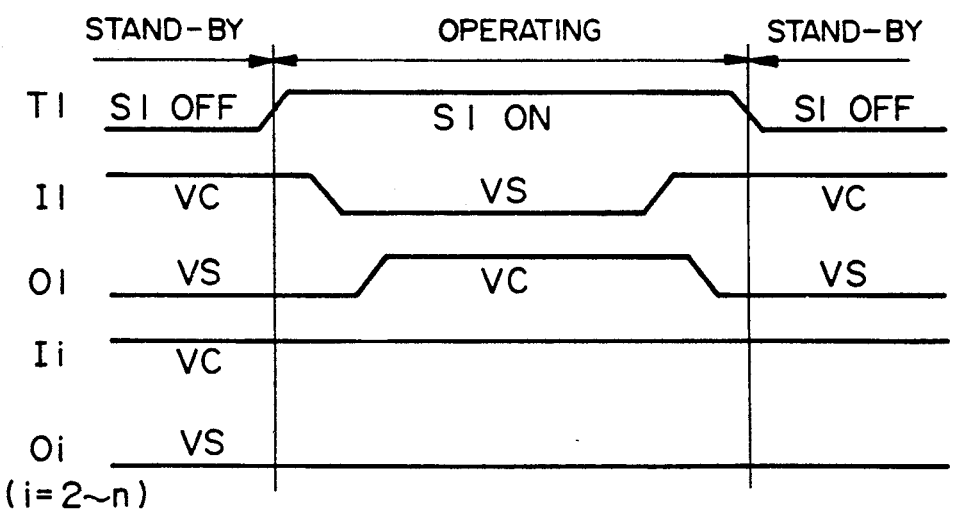
FIG. 2 is a time chart showing the operation of the first embodiment shown in FIG. 1.

The operation of the present circuit will hereinbelow be described with reference to FIG. 2. Now, we discuss with respect to a specific case that in the operation, only one circuit (C1 in this case) is operated. That is, a current which is to be supplied in the operation by the switch S1 may be only a current for one circuit (the current to be consumed in C1 in this case). Moreover, in FIG. 2, such a specific case is adopted that when T1 is at a high level, S1 is on, while when T1 is at a low level, S1 is off. In this connection, by the high level of T1, it means a voltage which is higher than a threshold voltage S1. Moreover, by the low level thereof, it means a voltage which is lower than the threshold voltage of S1.

In the initial stand-by state, an input $I_i$ of $C_i$ is at a high level VC, and an output $O_i$ is at a low level VS. In this connection, a P-channel MOS transistor is normally in an off state, and an N-channel MOS transistor is normally in an on state. However, by performing the shrink, a subthreshold current in the off state becomes a problem. That is, the subthreshold current which becomes a problem in case of no provision of the switch S1 is a current which flows, when the output $O_i$ is at a low level, from VC to VS through the P-channel MOS transistor which is off and the N-channel MOS transistor which is on. In the present embodiment, in the stand-by state, T1 is set to the low level so that the switch S1 is turned off. However, even when the switch S1 is turned off, the leakage current of the switch S1 cannot be disregarded. However, a leakage current of the switch S1 is set to a value smaller than the above subthreshold current. Therefore, at this time, the maximum current flowing from VC to $C_i$ is the leakage current of the switch S1. As a result, even when the MOS transistor having a low threshold voltage is used for $C_i$ in order to perform the low voltage operation, the current flowing through $C_i$ is not determined by the subthreshold current but is determined by the small leakage current of the switch S1. Therefore, the current consumption in the stand-by state is necessarily small.

Next, in the operation, T1 is at a high level and S1 is on, so that S1 supplies the current required to change the output $O_1$ of C1. Then, the input $I_1$ changes to be at a low level VS, and the output $O_1$ rises up to the voltage VC by the current from the power supply VC. Thereafter, the input $I_1$ becomes the high level VC and the output V1 becomes the low level VS. When the above operation has been completed, T1 becomes the low level in the stand-by state again, so that S1 is turned off.

SECOND EMBODIMENT

Figure 3:
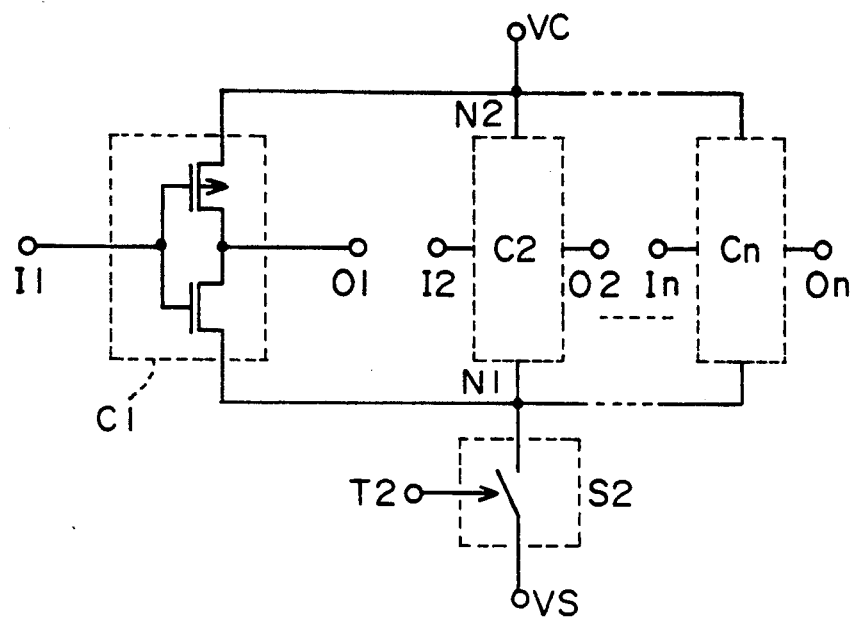
FIG. 3 is a circuit diagram showing a second embodiment of the present invention.
Figure 4:
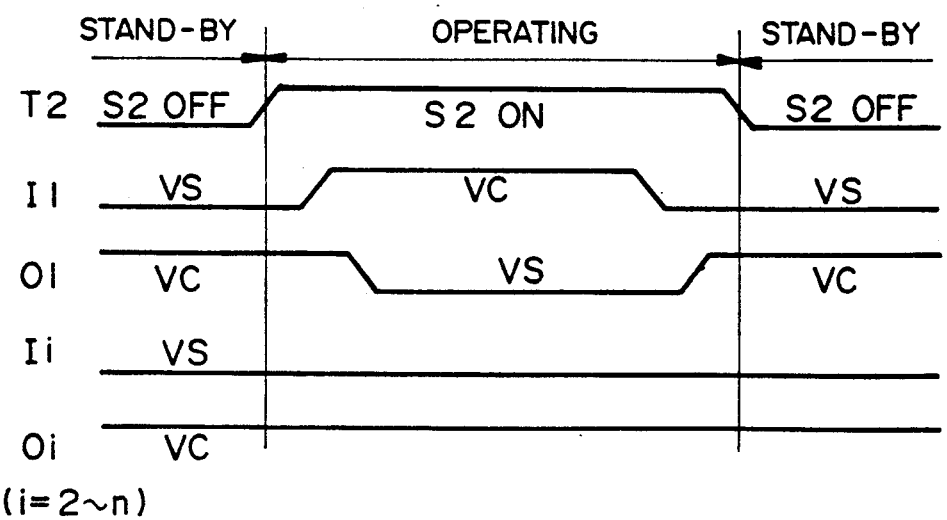
FIG. 4 is a time chart showing the operation of the second embodiment of FIG. 3.

FIG. 3 is a circuit diagram showing a second embodiment of the present invention. The second embodiment of FIG. 3 is the same in construction as the first embodiment of FIG. 1 except that instead of the provision of the switch S1 between VC and $C_i$, a switch S2 is provided between VS and $C_i$, and that the first power supply node N1 and the second power supply node N2 are reversed in position of the provision. The operation of the present circuit is shown in FIG. 4.

In the circuit of FIG. 3, a leakage current of the switch S2 is set to a value smaller than the subthreshold current of the N-channel MOS transistor of the circuit $C_i$ in which the low level is applied to the input $I_i$. Therefore, at this time, the maximum current flowing from $C_i$ to VS is the leakage current of the switch S2. As a result, even when the MOS transistor having a low threshold voltage is used for $C_i$ in order to perform the low voltage operation, the current flowing through $C_i$ is not determined by the subthreshold current but is determined by the leakage current of the small switch S2. Therefore, the current consumption in the stand-by stat is necessarily small.

Incidentally, the switch S2 may be composed of an N-channel MOS transistor or an NPN bipolar transistor.

THIRD EMBODIMENT

Figure 5:
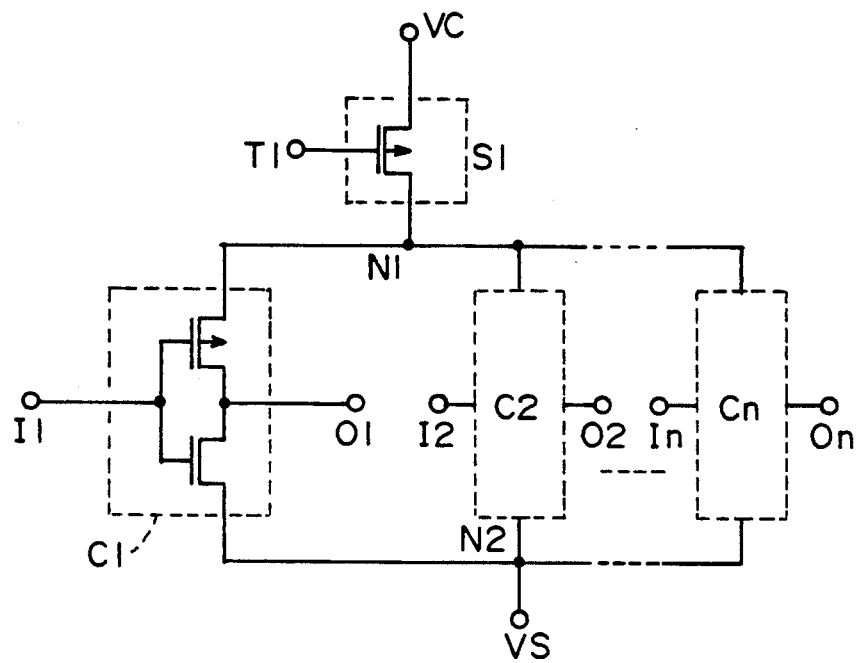
FIG. 5 is a circuit diagram showing a third embodiment of the present invention.

FIG. 5 is a block diagram showing a third embodiment of the present invention. In the present embodiment, the switch S1 of the first embodiment of FIG. 1 is concretely composed of a P-channel MOS transistor. The ability to drive a current of the P-channel MOS transistor S1 is set by taking the number of circuit $C_i$ for charging the output $O_i$ in response to the input $I_i$ of the low level into consideration. On the other hand, in order to reduce the current in the stand-by state, as described above, it is necessary to decrease the leakage current of the switch S1. Therefore, it is necessary to set a device parameter of the P-channel MOS transistor of the switch S1. For example, a gate width of the P-channel MOS transistor of the switch S1 is set so as to be smaller than the sum total of the gate widths of all of the P-channel MOS transistors of the circuits C1, C2, ..., Cn and larger than the gate width of the P-channel MOS transistor of one circuit $C_i$. The leakage current can be reduced by increasing the threshold voltage or the gate length of the P-channel MOS transistor of the switch S1, or by increasing the thickness of the gate insulating film. As a result, it is possible to reduce the current consumption in the stand-by state.

Figure 6:
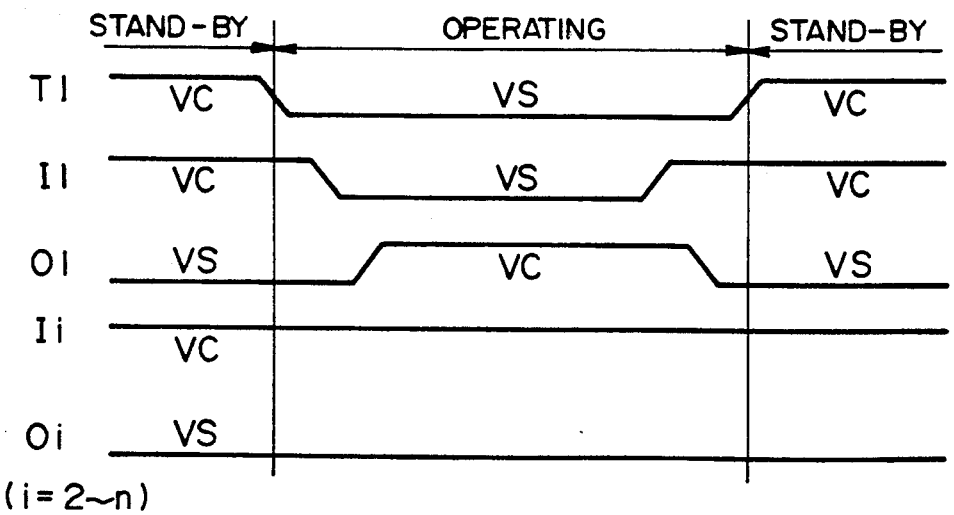
FIG. 6 is a time chart showing the operation of the third embodiment of FIG. 5.

The operation of the present circuit will hereinbelow be described with reference to FIG. 6. Incidentally, it is assumed that in the operation, only one circuit C1 outputs a signal of high level.

First, in the initial stand-by state, in the same manner as in the above-mentioned embodiments, the input Ii of Ci is at a high level VC, and the output Oi is at a low level VS. Moreover, since the subthreshold current flowing through the switching device S1 is smaller than the sum total of subthreshold currents C1, C2, ..., Cn, the potential at the common power supply terminal N drops gradually. Then, paying attention to the P-channel MOS transistor of the circuit C1 for example, though the gate voltage thereof is VC, the source voltage thereof is lower than VC. That is, since the P-channel MOS transistor becomes the deeper off state, the subthreshold current is largely reduced. The dependency of the subthreshold current on the voltage across the gate and the source ia about DECADE/100 mV. Therefore, if the voltage across the gate and the source drops by as much as 0.2 V, the subthreshold current is reduced to 1/100. As a result, if the period of the stand-by state increases to some degree, the current consumption can be reduced negligibly by the drop of the potential at the terminal N.

The present embodiment is the same as the above embodiments except that since the P-channel MOS transistor S1 is turned on in the operation, T1 becomes the low level VS. Incidentally, the switch S1 may be composed of a PNP bipolar transistor.

In case that the switch S1 is composed of the bipolar transistor, we need to set a device parameter (e.g., an emitter size) of the bipolar transistor to a predetermined value such that a leakage current of the bipolar transistor is smaller than the subthreshold currents of the CMOS circuits C1 to Cn, this leakage current flows through an emitter-collector path of the bipolar transistor in case that a control signal value of which is smaller than a base-emitter ON voltage of the bipolar transistor is supplied between the base and the emitter of the bipolar transistor, and in case that a first power supply node N1 and the second power supply node N2 of the plurality of CMOS circuits C1 to Cn are short-circuited, and this subthreshold currents flow through source-drain paths of N-channel MOS transistors of the CMOS circuits in case that signals values of which are smaller than threshold voltages of the N-channel MOS transistors are respectively supplied between the sources and the gates of the N-channel MOS transistors, and in case that the emitter and the collector of the switching NPN transistor is short-circuited.

FOURTH EMBODIMENT

Figure 7:
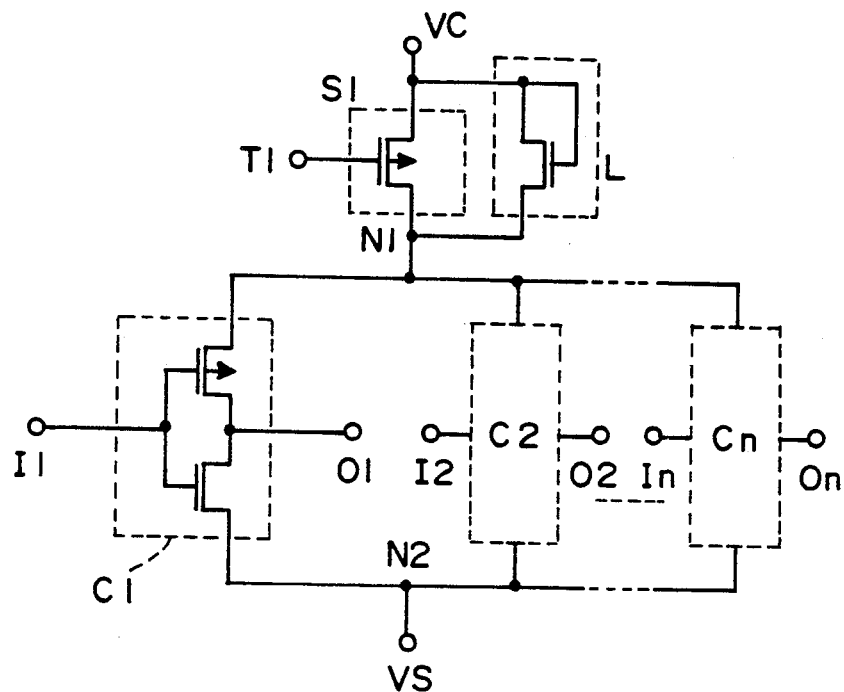
FIG. 7 is a circuit diagram showing a fourth embodiment of the present invention.

FIG. 7 is a circuit diagram showing a fourth embodiment of the present invention. The present embodiment may provide that a voltage clamping circuit L for maintaining the potential at the first power supply node N1 at a predetermined potential between VC and VS is provided between the power source VC and Ci and in parallel with the switch S1 of the third embodiment shown in FIG. 5.

For example, the voltage clamping circuit L is composed of an N-channel MOS transistor of source follower type which has a drain coupled with VC, a gate coupled with a predetermined potential, and a source connected to the node N1. In the present embodiment, this voltage clamping circuit is realized by the N-channel MOS transistor of diode connection in which the gate and the drain are short-circuited.

Figure 8:
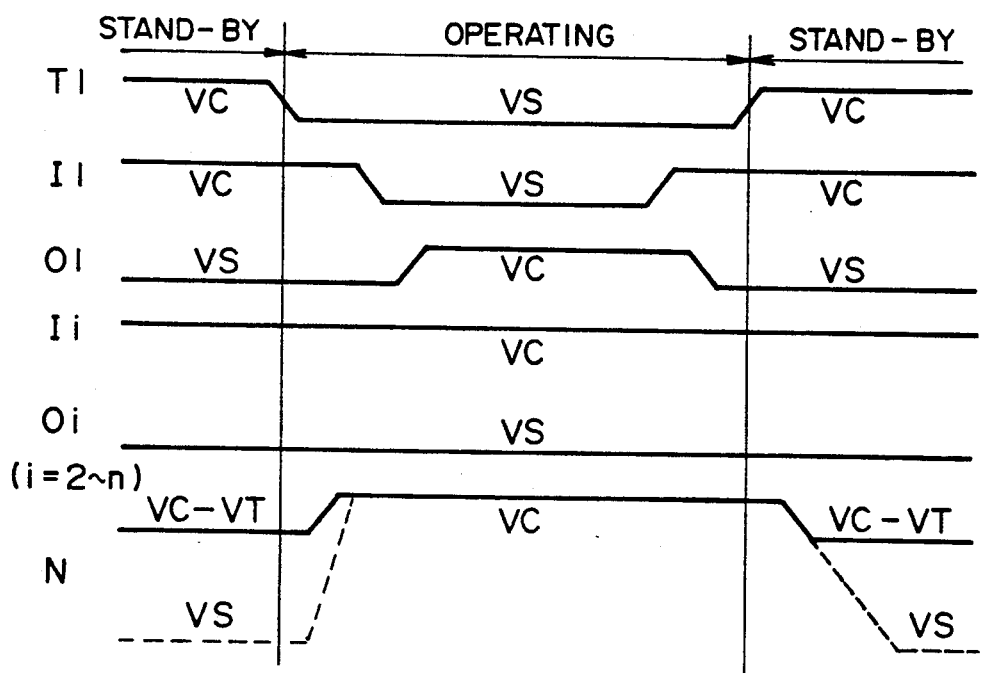
FIG. 8 is a time chart showing the operation of the fourth embodiment of FIG. 7.

The feature and the operation of the present circuit will hereinbelow be described with reference to FIG. 8. The initial state is the same as in the circuits of FIG. 5 and FIG. 6. At this time, in the stand-by state, the potential at the common power supply terminal N1 of Ci in case of the provision of the voltage clamping circuit L (indicated by a solid line) is, as shown in FIG. 8, different from that in case of no provision of the voltage clamping circuit L (indicated by a broken line). If the stand-by state continues for a very long period of time, in case of no provision of the voltage clamping circuit L, the potential at the terminal N1 drops down to VS in the worst case by the subthreshold current and other leakage currents flowing through Ci. Therefore, in order to make the operation proceed from the stand-by to the operation, first, the common power source terminal N1 needs to be changed, and therefore, the proceeding to the operating state is delayed until the charging operation is completed. On the other hand, assuming that the threshold voltage of the N-channel MOS transistor making up the voltage clamping circuit L is VT, in case of the provision of the voltage clamping circuit L, the potential at the common power source 15 terminal N drops down to no more than (VC−VT). Therefore, the proceeding to the operating state is completed for a short period of time. Incidentally, the level of the clamping potential (VC−VT) at the terminal N1 is set in such a way that the subthreshold current of Ci in the stand-by state in which VC is applied to the input is reduced negligibly in the same manner as in the above embodiments. For example, if VT is 0.2 V, and the gate-source voltage dependency of the subthreshold current is DECADE/100 mV, the subthreshold current can be reduced to a degree less than or equal to 1/100.

APPLICATION EXAMPLES

The present invention is suitable for reducing the current consumption in the stand-by state in case that the semiconductor integrated circuit, which includes a large number of CMOS circuits of the same type, has the operating mode of the stand-by state (the state in which the source voltage is not supplied substantially and it cannot be ensured that effective data is outputted from the output).

The semiconductor memory, e.g., a dynamic random access memory (DRAM), a static random access memory (SRAM), or the nonvolatile memory such as EEPROM includes the word decorders, the word drivers, the Y decoders and the Y drivers. Therefore, if in the stand-by state in which it cannot be ensured that the effective data is outputted from the output, the current consumption of those decoders and drivers is largely reduced, it can be ensured that the semiconductor memory acts as a battery for a long period of time.

The CMOS circuits of the present invention are applied to such decoders and drivers, whereby the current consumption is greatly reduced and the long-time battery operation can be ensured.

Figure 9:
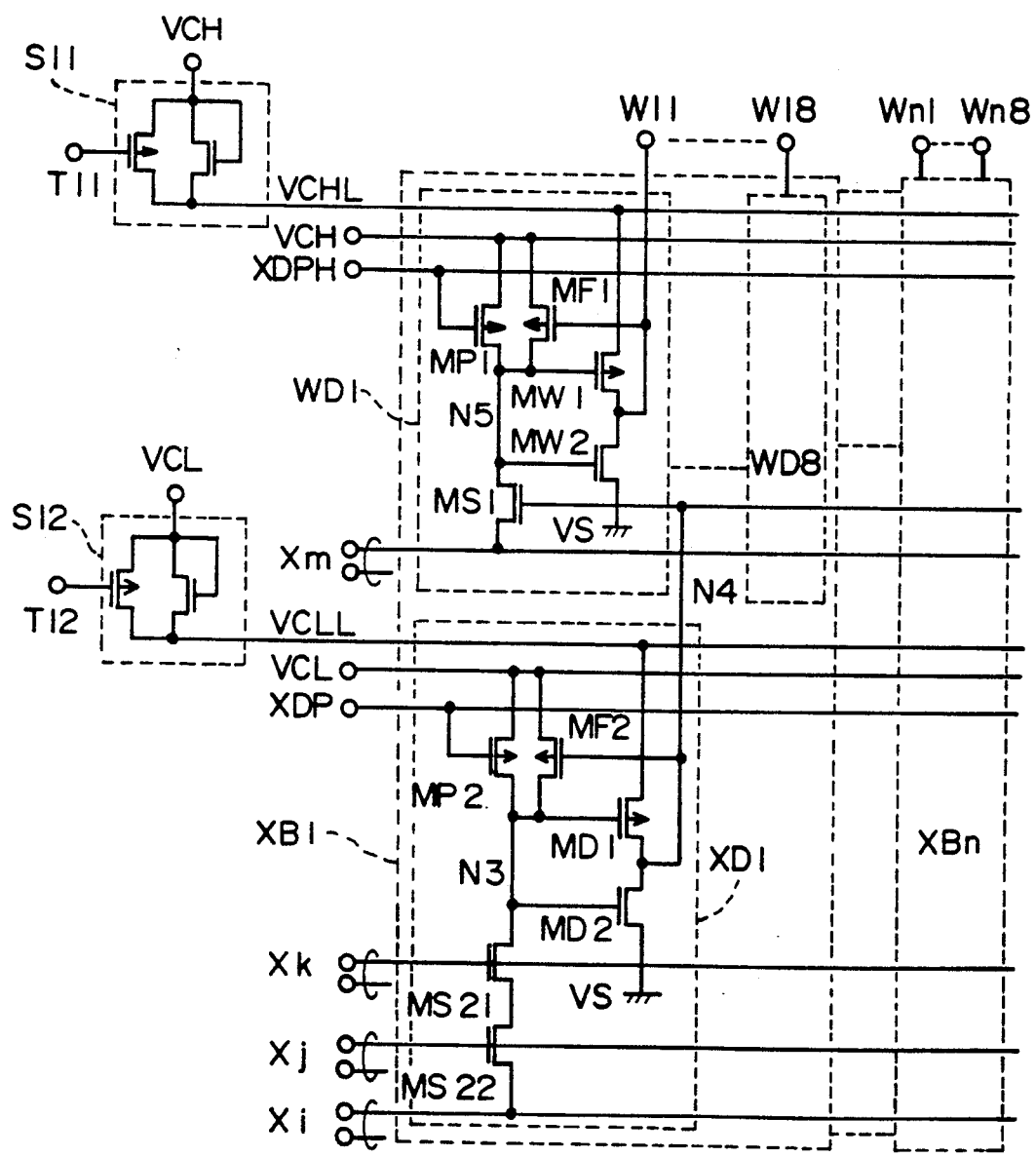
FIG. 9 is a circuit diagram showing a word driver/decoder to which the present invention is applied.

FIG. 9 is a circuit diagram showing an arrangement of an example in which the CMOS circuits of the present invention are applied to a word driver/decoder and the like of the dynamic random access memory.

In the figure, the reference symbols WD1 to WD8 designate word drivers. MOS transistors MW1 and MW2 for driving an output of each of the word drivers WD1 to WD8 correspond to Ci shown in FIG. 1. The reference symbol S11 designates a switch for supplying a current from a power source VCH to the MOS transistors MW1 and MW2.

Moreover, the reference symbol XD1 designate a decoder. MOS transistors MD1 and MD2 for driving an output of the decoder XD1 corresponds to Ci of FIG. 1. The reference symbol S12 designates a switch for supplying a current from a power supply VCL to the MOS transistors MD1 and MD2.

The source voltage VCH for the word drivers WD1 to WD8 is set to a high voltage required for providing memory cells (not shown) with sufficient storage voltages. For example, if the storage voltage of the memory cell is 1.5 V, VCH is set to 2.5 V.

Since the source voltage VCL for the decoder XD1 does not need to drive the memory cell directly, VCL is set to a low voltage as much as possible in such a way that the current consumption is reduced and the speed is not decreased so much. For example, VCL is set to 1.5 V. Therefore, VCH is set to a higher voltage than that of VCL. VCH is also, for example, obtained by boosting the external source voltage.

WD1 to WD8 and XD1 make up a circuit block XB1. In the present example, a specific case that n circuits blocks XB1 to XBn are provided is shown.

The reference symbols W11 to Wn8 designate word lines. In WD1, the P-channel MOS transistor MW1 and the N-channel MOS transistor MW2 make up a CMOS inverter for driving the word line W11. The reference symbol XDPH designates a precharge signal.

Moreover, P-channel MOS transistors MF1 and MF2 serve to perform the weak feed back from the output of the CMOS inverter to the input thereof in order to prevent the malfunction.

Figure 10:
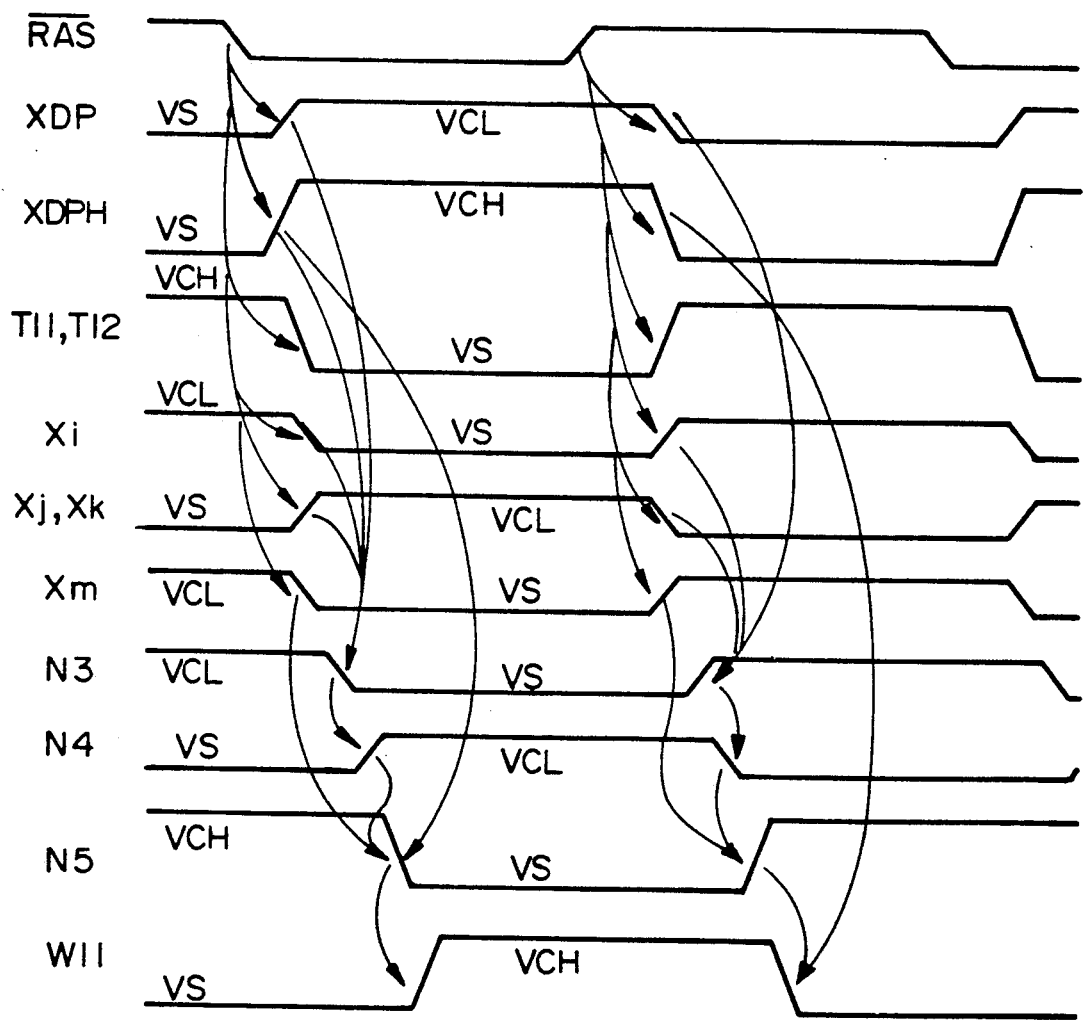
FIG. 10 is a time chart showing the operation of a circuit shown in FIG. 11.

Incidentally, the waveforms of the portions of the dynamic random access memory of FIG. 9 are as shown in FIG. 10.

Figure 11:
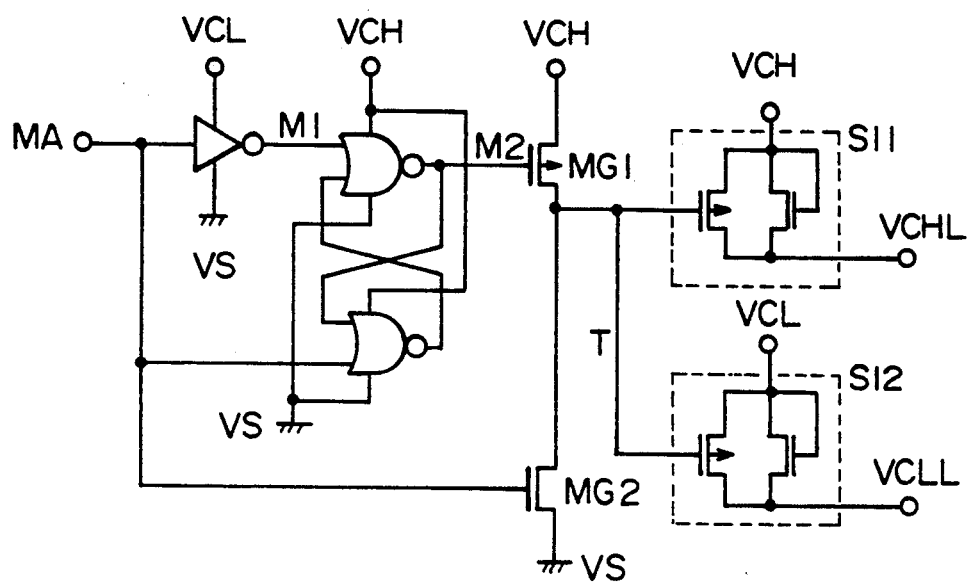
FIG. 11 is a circuit diagram showing an eample of a control circuit.

FIG. 11 is a circuit diagram showing an arrangement of an example of a control circuit for the switches S11 and S12 of FIG. 9. The reference symbol MA designates an input signal of this control circuit. In FIG. 9, T11 and T12 are provided for S11 and S12, respectively, whereas in the control circuit of FIG. 11, S11 and S12 are controlled in common by one output signal T.

Incidentally, by setting a gate width of MG2 to a value much larger than the gate width of MG1, T can be made at a low level VS through the change of MA to a high level VCL. When operating the circuit, it is required for the high speed operation that the switches S11 and S12 are quickly turned on. Therefore, such an arrangement may be adopted.

Figure 12:
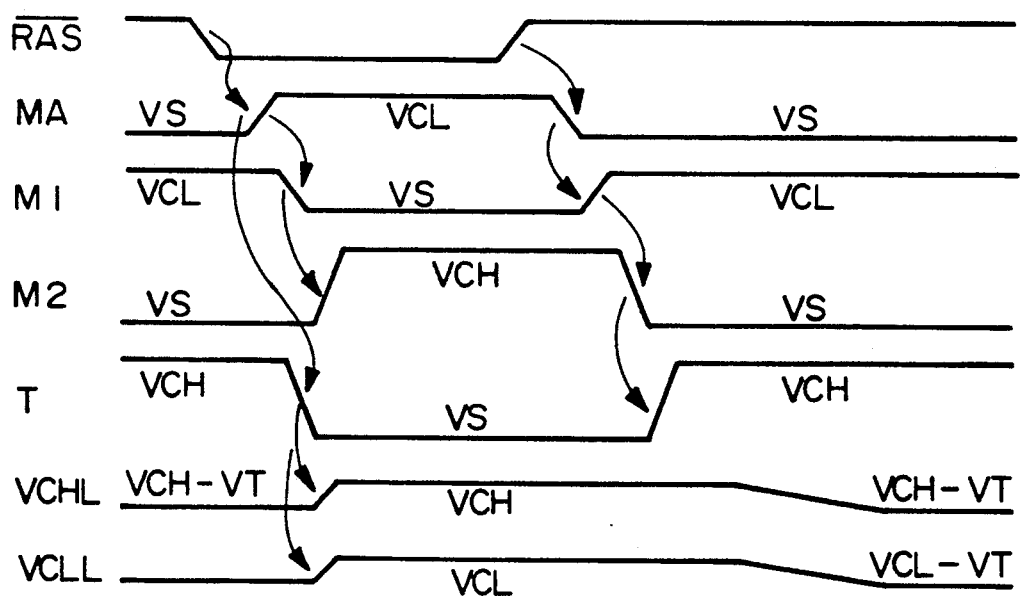
FIG. 12 is a time chart showing the operation of a circuit of FIG. 13.

The operating waveforms of the portions of the circuit of FIG. 11 are shown in FIG. 12.

Figure 13:
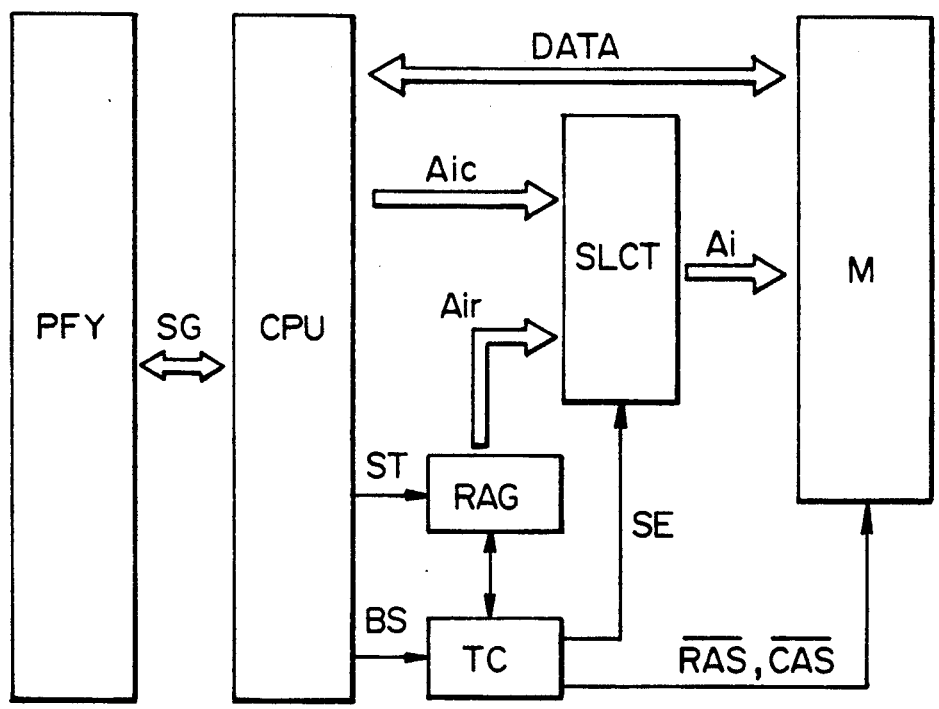
FIG. 13 is a block diagram showing a configuration of a system employing the present invention.

FIG. 13 is a block diagram showing a configuration of a data processing system in which the semiconductor memory of the present invention is used for a memory unit M. Arrows represent the flow of signals. In the figure, the reference symbol M designates DRAM employing the present invention; the reference symbol CPU designates a processor for controlling the whole system; the reference symbol RAG designates a unit for generating a refresh address; the reference symbol TC designates a unit for generating a control signal; the reference symbol SLCT designates a selection unit for switching an address signal sent from CPU and a refresh address signal sent from RAG; and the reference symbol PFY, other units in the system (e.g., an external memory unit, a display, a numerical calculatin unit and the like). PFY may be connected to other information processors through the communication lines in some cases.

The reference symbol DATA designates data which is communicated between CPU and M; the reference symbol Aic designates an address signal which is generated by CPU; the reference symbol Air designates a refresh address signal which is generated by RAG; the reference symbol Ai designates an address signal which is selected by SLCT to be sent to M; the reference symbol ST designates a status signal which is sent from CPU to RAG; the reference symbol BS; a busy signal which is sent from BS to CPU; the reference symbol SE, a signal which is sent from TC to actuate SLCT; and $\overline{RAS}$ and $\overline{CAS}$, signals for actuating DRAM employing the present invention. The reference symbol SG represents the exchange of the signals between CPU and other units in the system in the lump. As for M, SRAM, EEPROM or the like may be available. In this case, of course, the corresponding starting signal and control signal are used.

In the embodiment shown in FIG. 13, both the $\overline{RAS}$ signal and the $\overline{CAS}$ signal are set at a high level, and the memory unit M of DRAM proceeds to the stand-by state in which the current consumption is remarkably reduced, as described in the above embodiments. At this time, CPU can be changed to the stand-by state of low current consumption by the sleep instruction, and also other peripheral units can be also changed to the stand-by state of low current consumption.

In the semiconductor integrated circuit to which the present invention is applied, the current consumed therein can be made smaller than the subthreshold current of the MOS transistor having a small threshold voltage under the low source voltage suitable for the battery-drive. Therefore, it is possible to realize a semiconductor integrated circuit which is capable of operating at a high speed and with a low voltage, and a stand-by current of which is small.

What is claimed is:
1. A semiconductor integrated circuit comprising:
 a switching P-channel MOS transistor having a source, a drain and a gate; and
 a plurality of CMOS circuits having a first power supply node and a second power supply node,
 wherein said source of said switching P-channel MOS transistor is coupled with a first operating potential, said gate of said switching P-channel MOS transistor is controlled by a control signal, said drain of said switching P-channel MOS transistor is coupled with said first power supply node of said plurality of CMOS circuits, and said second power supply node of said plurality of CMOS circuits is coupled with a second operating potential,
 wherein a first subthreshold current flows through a source-drain path of said switching P-channel MOS transistor in case that said control signal value of which is smaller than a threshold voltage of said switching P-channel MOS transistor is supplied between said source and said gate of said switching P-channel MOS transistor, and in case that said first power supply node and said second power supply node of said plurality of CMOS circuits are short-circuited,
 wherein second subthreshold currents flow through source-drain paths of P-channel MOS transistors of said plurality of CMOS circuits in case that signals values of which are smaller than threshold voltages of said P-channel MOS transistors are respectively supplied between said sources and said gates of said P-channel MOS transistors, and in case that said source and said drain of said switching P-channel MOS transistors are short-circuited, and wherein a device parameter of said switching P-channel MOS transistor is set to a predetermined value such that said first subthreshold current is set to a value smaller than said second subthreshold currents.

2. A semiconductor integrated circuit according to claim 1, wherein said P-channel MOS transistors of said plurality of CMOS circuits make up, together with a plurality of N-channel MOS transistors of said plurality of CMOS circuits, CMOS inverter circuits.

3. A semiconductor integrated circuit according to claim 1, further comprising:
a plurality of word lines;
a plurality of data lines arranged so as to cross said plurality of word lines; and
memory cells arranged at intersections between said plurality of word lines and said plurality of data lines,
wherein said plurality of CMOS circuits make up word driver circuits for selecting said plurality of word lines.

4. A semiconductor integrated circuit according to claim 1, further comprising a voltage clamping circuit for maintaining a potential at said first power supply node at a predetermined potential between said first operating potential and said second operating potential.

5. A semiconductor integrated circuit according to claim 4, wherein said voltage clamping circuit is composed of an N-channel MOS transistor which has a drain coupled with said first operating potential, a gate coupled with a predetermined potential, and a source connected to said first power supply node.

6. A semiconductor integrated circuit according to claim 5, wherein said gate and said drain of said N-channel MOS transistor of said voltage clamping circuit is short-circuited.

7. A semiconductor integrated circuit according to claim 1, wherein said device parameter of said switching P-channel MOS transistor is a gate width of said P-channel MOS transistor.

8. A semiconductor integrated circuit comprising:
a switching N-channel MOS transistor having a source, a drain and a gate; and
a plurality of CMOS circuits having a first power supply node and a second power supply node,
wherein said source of said switching N-channel MOS transistor is coupled with a first operating potential, said gate of said switching N-channel MOS transistor is controlled by a control signal, said drain of said switching N-channel MOS transistor is coupled with said first power supply node of said plurality of CMOS circuits, and said second power supply node of said plurality of CMOS circuits is coupled with a second operating potential,
wherein a first subthreshold current flows through a source-drain path of said switching N-channel MOS transistor in case that said control signal value of which is smaller than a threshold voltage of said switching N-channel MOS transistor is supplied between said source and said gate of said switching N-channel MOS transistor, and in case that said first power supply node and said second power supply node of said plurality of CMOS circuits are short-circuited, wherein second subthreshold currents flow through source-drain paths of N-channel MOS transistors of said plurality of CMOS circuits in case that signals values of which are smaller than threshold voltages of said N-channel MOS transistors are respectively supplied between said sources and said gates of said N-channel MOS transistors, and in case that said source and said drain of said switching N-channel MOS transistors are short-circuited, and wherein a device parameter of said switching N-channel MOS transistor is set to a predetermined value such that said first subthreshold current is set to a value smaller than said second subthreshold currents.

9. A semiconductor integrated circuit according to claim 8, wherein said N-channel MOS transistors of said plurality of CMOS circuits make up, together with a plurality of P-channel MOS transistors of said plurality of CMOS circuits, CMOS inverter circuits.

10. A semiconductor integrated circuit according to claim 8, further comprising:
a plurality of word lines;
a plurality of data lines arranged so as to cross said plurality of word lines; and
memory cells arranged at intersections between said plurality of word lines and said plurality of data lines,
wherein said plurality of CMOS circuits make up word driver circuits for selecting said plurality of word lines.

11. A semiconductor integrated circuit according to claim 8, further comprising a voltage clamping circuit for maintaining a potential at said first power supply node at a predetermined potential between said first operating potential and said second operating potential.

12. A semiconductor integrated circuit according to claim 11, wherein said voltage clamping circuit is composed of an P-channel MOS transistor which has a drain coupled with said first operating potential, a gate coupled with a predetermined potential, and a source connected to said first power supply node.

13. A semiconductor integrated circuit according to claim 12, wherein said gate and said drain of said P-channel MOS transistor of said voltage clamping circuit is short-circuited.

14. A semiconductor integrated circuit according to claim 8, wherein said device parameter of said switching N-channel MOS transistor is a gate width of said N-channel MOS transistor.

15. A semiconductor integrated circuit comprising:
a switching PNP transistor having an emitter, a collector and a base; and
a plurality of CMOS circuits having a first power supply node and a second power supply node,
wherein said source of said switching PNP transistor is coupled with a first operating potential, said base of said switching PNP transistor is controlled by a control signal, said collector of said switching PNP transistor is coupled with said first power supply node of said plurality of CMOS circuits, and said second power supply node of said plurality of CMOS circuits is coupled with a second operating potential,
wherein a leakage current flows through an emitter-collector path of said switching PNP transistor in case that said control signal value of which is smaller than a base-emitter ON voltage of said switching PNP transistor is supplied between said base and said emitter of said switching PNP transistor, and in case that said first power supply node and said second power supply node of said plurality of CMOS circuits are short-circuited, wherein subthreshold currents flow through source-drain paths of P-channel MOS transistors of said plurality of CMOS circuits in case that signals values of which are smaller than threshold voltages of said P-channel MOS transistors are respectively supplied between said sources and said gates of said P-channel MOS transistors, and in case that said emitter and said collector of said switching PNP transistor is short-circuited, and wherein a device parameter of said switching PNP transistor is set to a predetermined value such that said leakage current is set to a value smaller than said subthreshold currents.

16. A semiconductor integrated circuit according to claim 15, wherein said P-channel MOS transistors of said plurality of CMOS circuits make up, together with a plurality of N-channel MOS transistors of said plurality of CMOS circuits, CMOS inverter circuits.

17. A semiconductor integrated circuit according to claim 15, further comprising:
a plurality of word lines;
a plurality of data lines arranged so as to cross said plurality of word lines; and
memory cells arranged at intersections between said plurality of word lines and said plurality of data lines,
wherein said plurality of CMOS circuits make up word driver circuits for selecting said plurality of word lines.

18. A semiconductor integrated circuit according to claim 15, further comprising a voltage clamping circuit for maintaining a potential at said first power supply node at a predetermined potential between said first operating potential and said second operating potential.

19. A semiconductor integrated circuit according to claim 18, wherein said voltage clamping circuit is composed of an N-channel MOS transistor which has a drain coupled with said first operating potential, a gate coupled with a predetermined potential, and a source connected to said first power supply node.

20. A semiconductor integrated circuit according to claim 19, wherein said gate and said drain of said N-channel MOS transistor of said voltage clamping circuit is short-circuited.

21. A semiconductor integrated circuit according to claim 15, wherein said device parameter of said switching PNP transistor is an emitter size of said PNP transistor.

22. A semiconductor integrated circuit comprising:
a switching NPN transistor having an emitter, a collector and a base; and
a plurality of CMOS circuits having a first power supply node and a second power supply node,
wherein said source of said switching NPN transistor is coupled with a first operating potential, said base of said switching NPN transistor is controlled by a control signal, said collector of said switching NPN transistor is coupled with said first power supply node of said plurality of CMOS circuits, and said second power supply node of said plurality of CMOS circuits is coupled with a second operating potential, wherein a leakage current flows through an emitter-collector path of said switching NPN transistor in case that said control signal value of which is smaller than a base-emitter ON voltage of said switching NPN transistor is supplied between said base and said emitter of said switching NPN transistor, and in case that said first power supply node and said second power supply node of said plurality of CMOS circuits are short-circuited, wherein subthreshold currents flow through source-drain paths of N-channel MOS transistors of said plurality of CMOS circuits in case that signals values of which are smaller than threshold voltages of said N-channel MOS transistors are respectively supplied between said sources and said gates of said N-channel MOS transistors, and in case that said emitter and said collector of said switching NPN transistor is short-circuited, and wherein a device parameter of said switching NPN transistor is set to a predetermined value such that said leakage current is set to a value smaller than said subthreshold currents.

23. A semiconductor integrated circuit according to claim 22, wherein said N-channel MOS transistors of said plurality of CMOS circuits make up, together with a plurality of P-channel MOS transistors of said plurality of CMOS circuits, CMOS inverter circuits.

24. A semiconductor integrated circuit according to claim 22, further comprising:
a plurality of word lines;
a plurality of data lines arranged so as to cross said plurality of word lines; and
memory cells arranged at intersections between said plurality of word lines and said plurality of data lines,
wherein said plurality of CMOS circuits make up word driver circuits for selecting said plurality of word lines.

25. A semiconductor integrated circuit according to claim 22, further comprising a voltage clamping circuit for maintaining a potential at said first power supply node at a predetermined potential between said first operating potential and said second operating potential.

26. A semiconductor integrated circuit according to claim 25, wherein said voltage clamping circuit is composed of a P-channel MOS transistor which has a drain coupled with said first operating potential, a gate coupled with a predetermined potential, and a source connected to said first power supply node.

27. A semiconductor integrated circuit according to claim 26, wherein said gate and said drain of said P-channel MOS transistor of said voltage clamping circuit is short-circuited.

28. A semiconductor integrated circuit according to claim 22, wherein said device parameter of said switching NPN transistor is an emitter size of said switching NPN transistor.

* * * * *